United States Patent [19]

Froom et al.

[11] 3,946,336

[45] Mar. 23, 1976

[54] MICROWAVE SOLID STATE CIRCUIT EMPLOYING A BIPOLAR TRANSISTOR STRUCTURE

[75] Inventors: Jocelyn Froom, Bishop Stortford; John Edward Carroll, Cambridge, both of England

[73] Assignee: International Standard Electric Corporation, New York, N.Y.

[22] Filed: Feb. 26, 1975

[21] Appl. No.: 553,351

[30] Foreign Application Priority Data
Apr. 25, 1974 United Kingdom............... 18123/74

[52] U.S. Cl.................. 331/107 R; 330/5; 330/12; 330/61 A; 331/107 G; 331/108 R; 357/3; 357/34; 357/57
[51] Int. Cl.² .... H03B 9/12; H03F 3/19; H03F 3/55
[58] Field of Search........ 331/107 R, 107 G, 108 R, 331/96; 330/5, 12, 61 A; 357/34, 3, 57

[56] References Cited
UNITED STATES PATENTS

| | | | |
|---|---|---|---|
| 3,531,698 | 9/1970 | Atalla | 331/107 G X |
| 3,855,605 | 12/1974 | Kawamoto | 357/57 X |

OTHER PUBLICATIONS
Atalla et al., "Emitter Controlled Negative Resistance In GaAs" Solid State Electronics, Vol. 12, Aug. 1969, pp. 619–629.

*Primary Examiner*—Siegfried H. Grimm
*Attorney, Agent, or Firm*—John T. O'Halloran; Menotti J. Lombardi, Jr.; Alfred C. Hill

[57] ABSTRACT

This microwave circuit incorporates a transistor structure that provides either a two port amplifier or an injection frequency locked oscillator. This circuit eliminates circulators employed with Gunn and Impatt diode amplifiers and injection frequency locked oscillators. The collector-base junction is reverse biased so that the collector region functions either in the Impatt mode or in the transferred electron mode. An RF input signal is applied across the forward biased emitter-base junction. With a load across the collector-base junction having a conductance equal to the absolute value of the negative conductance generated by the collector region, the circuit functions as an oscillator at a frequency which is injection locked to the frequency of the input signal. With a load of increased conductance to suppress oscillations, i.e. overload the collector region, the circuit functions as an amplifier.

4 Claims, 1 Drawing Figure

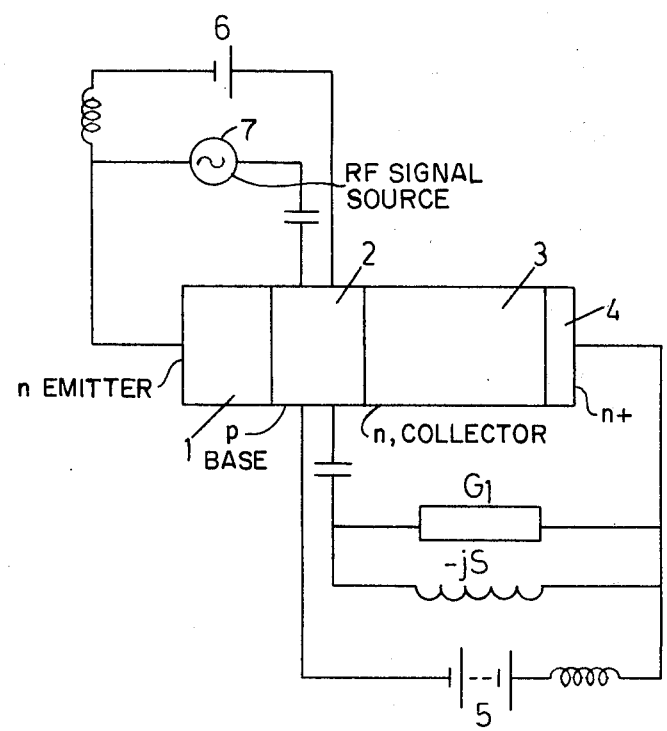

3,946,336

MICROWAVE SOLID STATE CIRCUIT EMPLOYING A BIPOLAR TRANSISTOR STRUCTURE

BACKGROUND OF THE INVENTION

This invention relates to microwave solid state circuits.

SUMMARY OF THE INVENTION

An object of the present invention if to provide a microwave solid state circuit capable of operating as an oscillator injection locked by the input signal or as an amplifier of the input signal without employing circulators.

Another object of the present invention is to provide a microwave solid state circuit having a bipolar transistor structure having a collector region that will operate in either an Impatt mode or a transferred electron mode.

A feature of the present invention is to provide a microwave solid state circuit comprising: a bipolar transistor structure having a base region, an emitter region and a collector region; first means coupled to the base region and the emitter region to apply a radio frequency input signal and a first bias voltage across the emitter-base junction so that current modulated at the frequency of the input signal is injected into the collector region; second means coupled to the base region and the collector region for reverse biasing the collector-base junction so that the collector region operates in a selected one of an Impatt mode and a transferred electron mode; and third means coupled to the base region and the collector region for loading the collector-base junction such that the circuit operates as a selected one of an oscillator injection locked by the input signal and an amplifier of the input signal.

BRIEF DESCRIPTION OF THE DRAWING

The above-mentioned and other features and objects of the present invention and the manner of obtaining them will become more apparent by reference to the following description taken in conjunction with the drawing, the single FIGURE of which shows, in schematic form, a microwave solid state circuit for operation at X-band, e.g. 10GHz, as either an amplifier or an injection locked oscillator in accordance with the principles of the present invention.

DESCRIPTION OF THE PREFERRED EMBODIMENTS

In a first embodiment, the circuit comprises a bipolar transistor structure, which may be either of the n-p-n or the p-n-p type, but here considered as of the n-p-n type, with an n-type emitter 1, a p-type base 2, and an n-type collector 3 with an n+ collector contact region 4.

The base-collector junction is subjected to a reverse bias 5 such that collector region 3 operates with one or more of the features of the n- region of an Impatt diode, that is to say using avalanche multiplication and signal delay caused by transit time of the charge carriers.

Accordingly, in this first embodiment the semiconductor material of the transistor structure is of suitable material such as silicon or gallium arsenide, and preferably either the emitter region 1 or the collector region 3, or both the emitter and the collector regions are of a semiconductor material having a higher energy gap than that of the base region, e.g. the emitter and/or collector are of gallium aluminum arsenide and the base of gallium arsenide.

With a forward bias 6 applied to the emitter-base of the transistor structure, an RF (radio frequency) signal from RF signal source 7 at the desired frequency of operation will result in current modulated at this frequency being injected into collector region 3. The base-collector junction is biased to avalanche. The collector region 3 may have a maximum length given by IMPATT theory (say $2\mu m$ for a 10 GHz device). Avalanche multiplication and possibly IMPATT operation will occur within it.

Under these conditions, the base-collector generates a conductance -G and susceptance S with a current M times greater than that injected by the emitter 1. For the device to amplify, the loading across the base-collector must neutralize any negative conductance so that oscillation does not occur. This may be achieved, for example, by a load conductance $G_1 > G$.

To operate as an oscillator, the current density must be high enough to give sufficient negative conductance -G for oscillation. The load conductance $G_1$ in this mode of operation has to be equal to G, and the frequency of oscillation can be injection locked to the applied RF signal with correct choice of resonant circuit around the collector-base.

The emitter-base region acts in a very similar manner to conventional transistors, in that the emitter injects electrons into the base-collector junction. However, because of the avalanche multiplication in the base-collector region it will be necessary to inject a small number of electrons relative to normal transistor action. Accordingly proper operation is achieved even with a poor base transport factor.

Unlike conventional transistors, it is desirable that most of the collector current be supplied via the base. The base-collector region is biased into avalanche breakdown so that electrons are travelling to the collector and a nearly equal number of holes are travelling towards the base. The holes could travel across the base to the emitter, but this would lower the emitter efficiency. By using a wide band-gap emitter, there is a built-in potential barrier which tends to prevent the holes from reaching the emitter. The holes thus generated in the avalanche regions of the collector-base junction have to come out at the base terminal, where holes are majority carriers.

In a highly simplified analysis where the collector-base output region only is considered, and with attention confined to small signals, superposition may be used to assert that the avalanche multiplication combined with transit time delay gives an output admittance $Y = -G + jS$. Taking the current from the emitter as $i_{el}$, this will be reduced on reaching the base-collector junction by the product of the emitter efficiency $Y$, the base transport factor $a_b$, and the collector efficiency. The product of these three factors will be taken to be $\alpha$, so that $\alpha i_{el}$ electrons are injected into the avalanche region. The injected current will induce a net external current of $M\alpha i_{el}$, where M is some complex number giving the phase shift from the injected carriers, the phase shift coming from the transit time and any multiplication from the avalanche. With a load of $G_1-j$s connected, and considering only the action at resonance, $$V_{out} = M\alpha i_{el}/(G_1-G) \text{ and}$$

$$P_{out} = |M\alpha i_{el}/(G_1-G)|^2 G_1$$

It can be seen that the output power, and hence the power gain, is increased by a factor of $|MG_1/G_1-G|^2$ over the value to be expected if avalanche multiplication and IMPATT action were absent. The input impedance, for a given level of $i_e$, is very similar to the input impedance for a conventional transistor because the input stage is not greatly different. Looked at in another way, it can be said that the base transport factor could become worse by a factor of $|M/(G_1-G)|$ compared to the conventional transistor. Thus, a wider base region is premissible in this transistor structure, and this in turn would allow the base to take a greater current and lessen any effects of current crowding at the base contact.

It may be seen that the multiplication factor M alone, even if the output conductance is positive, will give enhanced gain. This will be useful at current densities lower than for normal Impatt operation.

The base-collector region may be made substantially longer, perhaps by a factor of three, than in a conventional transistor. This would give higher voltages at a given frequency than in the normal transistor.

In the second embodiment, the collector region is designed and operated to function as a transferred electron device. Accordingly the transistor collector structure is made in n-type gallium arsenide or other material demonstrating transferred electron effects. The collector-base bias is such as to establish within the collector region an electric field distribution which causes the transferred electron mode of operation, the appropriate mode being determined by the value of the electric field in relation to the so-called threshold value to obtain, for example, the Gunn mode, or the limited-space charge accumulation mode, or the hybrid mode.

The application of forward bias and input signal across the emitter-base junction, and the loading of the collector-base junction to obtain operation either as an amplifier or as an injection-locked oscillator, are as already described for the first embodiment.

The transistor structure may be of the same semiconductor material throughout, e.g. of gallium arsenide, but preferably the emitter is of a suitable semiconductor material having a higher energy gap than that of the base region, e.g. the emitter is of gallium aluminum arsenide. The collector region may also have variations in material or doping in order to optimise the phenomena observed in IMPATT or transferred electron action.

The two embodiments described above provide two port amplifiers or frequency locked oscillators at frequencies around X-band, at which it is difficult to get conventional transistors to operate. There is no need for circulators, at present used with Gunn and IMPATT diode (one port) amplifiers or injection locked oscillators, which are expensive and may restrict performance. Further, such two-port amplifiers are less sensitive to variations in device parameters than reflection amplifiers.

While we have described above the principles of our invention in connection with specific apparatus it is to be clearly understood that this description is made only by way of example and not as a limitation to the scope of our invention as set forth in the objects thereof and in the accompanying claims.

We claim:

1. A microwave solid state circuit comprising:
a bipolar transistor structure having a base region, an emitter region and a collector region;
first means coupled to said base region and said emitter region to apply a radio frequency input signal and a first bias voltage across the emitter-base junction so that current modulated at the frequency of said input signal is injected into said collector region;
second means coupled to said base region and said collector region for reverse biasing the collector-base junction; and
third means coupled to said base region and said collector region for loading the collector-base junction such that said circuit operates as a selected one of an oscillator injection locked by said input signal and an amplifier of said input signal;
said collector region operating in an Impatt mode, and
said emitter region including a semiconductor material of higher energy gap than the semiconductor material of said base region.

2. A microwave solid state circuit comprising:
a bipolar transistor structure having a base region, an emitter region and a collector region;
first means coupled to said base region and said emitter region to apply a radio frequency input signal and a first bias voltage across the emitter-base junction so that current modulated at the frequency of said input signal is injected into said collector region;
second means coupled to said base region and said collector region for reverse biasing the collector-base junction; and
third means coupled to said base region and said collector region for loading the collector-base junction such that said circuit operates as a selected one of an oscillator injection locked by said input signal and an amplifier of said input signal;
said collector region operating in an Impatt mode, and
said collector region including a semiconductor material of higher energy gap than the semiconductor material of said base region.

3. A microwave solid state circuit comprising:
a bipolar transistor structure having a base region, an emitter region and a collector region;
first means coupled to said base region and said emitter region to apply a radio frequency input signal and a first bias voltage across the emitter-base junction so that current modulated at the frequency of said input signal is injected into said collector region;
second means coupled to said base region and said collector region for reverse biasing the collector-base junction; and
third means coupled to said base region and said collector region for loading the collector-base junction such that said circuit operates as a selected one of an oscillator injection locked by said input signal and an amplifier of said input signal;
said collector region operating in an Impatt mode, and
said emitter region and said collector region both including a semiconductor material of higher energy gap than the semiconductor material of said base region.

4. A microwave solid state circuit comprising:

a bipolar transistor structure having a base region, an emitter region and a collector region;

first means coupled to said base region and said emitter region to apply a radio frequency input signal and a first bias voltage across the emitter-base junction so that current modulated at the frequency of said input signal is injected into said collector region;

second means coupled to said base region and said collector region for reverse biasing the collector-base junction; and third means coupled to said base region and said collector region for loading the collector-base junction such that said circuit operates as a selected one of an oscillator injection locked by said input signal and an amplifier of said imput signal;

said collector region operating in a transferred electron mode, and said emitter region including a semiconductor material of higher energy gap than the semiconductor material of said base region.

* * * * *